(12) United States Patent
Ishii et al.

(10) Patent No.: US 11,521,768 B2
(45) Date of Patent: Dec. 6, 2022

(54) FERRITE POWDER, RESIN COMPOSITION, AND MOLDED BODY

(71) Applicant: POWDERTECH CO., LTD., Kashiwa (JP)

(72) Inventors: Kazutaka Ishii, Kashiwa (JP); Koji Aga, Kashiwa (JP); Takao Sugiura, Kashiwa (JP); Takashi Kojima, Kashiwa (JP)

(73) Assignee: POWDERTECH CO., LTD., Chiba (JP)

( * ) Notice: Subject to any disclaimer, the term of this patent is extended or adjusted under 35 U.S.C. 154(b) by 180 days.

(21) Appl. No.: 16/496,357

(22) PCT Filed: Mar. 30, 2018

(86) PCT No.: PCT/JP2018/013991
§ 371 (c)(1),
(2) Date: Sep. 20, 2019

(87) PCT Pub. No.: WO2018/182021
PCT Pub. Date: Oct. 4, 2018

(65) Prior Publication Data
US 2020/0143966 A1    May 7, 2020

(30) Foreign Application Priority Data
Mar. 31, 2017  (JP) .................. JP2017-073209

(51) Int. Cl.
*H01F 1/11*    (2006.01)
*B29C 41/08*    (2006.01)
(Continued)

(52) U.S. Cl.
CPC ............... *H01F 1/11* (2013.01); *B29C 41/08* (2013.01); *G11B 5/70678* (2013.01);
(Continued)

(58) Field of Classification Search
None
See application file for complete search history.

(56) References Cited

U.S. PATENT DOCUMENTS 4,042,516 A    8/1977 Matsumoto et al.
4,116,752 A    9/1978 Matsumoto et al.
(Continued)

FOREIGN PATENT DOCUMENTS

CN    105122389 A    12/2015
CN    105637601 A    6/2016
(Continued)

OTHER PUBLICATIONS

Translation of Li, Xiangcheng et al. NPL article previously cited. (Year: 2013).*
(Continued)

*Primary Examiner* — Kevin M Bernatz
(74) *Attorney, Agent, or Firm* — Procopio, Cory, Hargreaves & Savitch LLP

(57) ABSTRACT

The ferrite powder of the present invention is a ferrite powder containing a plurality of ferrite particles, wherein the ferrite particles each are a single crystal body having an average particle diameter of 1-2,000 nm, and have a polyhedron shape, and wherein the ferrite particles each contain 2.0-10.0 mass % of Sr, and 55.0-70.0 mass % of Fe.

3 Claims, 5 Drawing Sheets

(51) Int. Cl.
*G11B 5/706* (2006.01)
*G11B 5/714* (2006.01)
*H01F 1/113* (2006.01)

(52) U.S. Cl.
CPC .............. *G11B 5/714* (2013.01); *H01F 1/113* (2013.01); *C01P 2004/04* (2013.01); *C01P 2006/12* (2013.01); *C01P 2006/42* (2013.01)

(56) References Cited

U.S. PATENT DOCUMENTS

| | | | |
|---|---|---|---|
| 4,336,242 | A | 6/1982 | Schmidberger et al. |
| 4,765,920 | A | 8/1988 | Gattuso et al. |
| 5,736,111 | A * | 4/1998 | Saegusa ............. C01G 49/0036 |
| | | | 423/594.1 |
| 10,825,593 | B2 * | 11/2020 | Kojima ................... H01F 1/37 |
| 2002/0017628 | A1 | 2/2002 | Akimoto et al. |
| 2002/0197461 | A1 | 12/2002 | Takaya et al. |
| 2013/0256584 | A1 | 10/2013 | Yamazaki et al. |
| 2015/0187380 | A1 * | 7/2015 | Shirata ...................... H01F 1/11 |
| | | | 427/127 |
| 2016/0039128 | A1 | 2/2016 | Nishio et al. |
| 2016/0217817 | A1 | 7/2016 | Masada et al. |
| 2016/0217892 | A1 | 7/2016 | Nishio et al. |
| 2018/0244537 | A1 * | 8/2018 | Yamada ............. C01G 49/0036 |
| 2018/0366152 | A1 * | 12/2018 | Naoi .................. C01G 49/0018 |
| 2020/0251262 | A1 * | 8/2020 | Morita ................ C04B 35/2675 |

FOREIGN PATENT DOCUMENTS

| | | |
|---|---|---|
| EP | 1170757 A2 | 1/2002 |
| EP | 3057110 A1 | 8/2016 |
| JP | S50-121200 A | 9/1975 |
| JP | S55074107 A | 6/1980 |
| JP | S56006411 A | 1/1981 |
| JP | S62001149 A | 1/1987 |
| JP | H05258932 A | 10/1993 |
| JP | H09048618 A | 2/1997 |
| JP | 2002025816 A | 1/2002 |
| JP | 2003104790 A | 4/2003 |
| JP | 2013211316 A | 10/2013 |
| JP | 2016139451 A | 8/2016 |
| WO | 2015-050119 A1 | 4/2015 |
| WO | 2016136701 A1 | 9/2016 |

OTHER PUBLICATIONS

Extended European Search Report for related EP App No. 18778294.1 dated Dec. 11, 2020, 9 pgs.

Kazin, P.E., et al., Formation of Submicron-Sized $SrFe_{12-x}Al_xo_{19}$ with Very High Coercivity, Journal of Magnetism and Magnetic Materials, 320, 2008, pp. 1068-1072.

Kim, K., et al., Effects of Calcination Conditions on Magnetic Properties in Strontium Ferrite Synthesized by the Molten Salt Method, IEEE Transactions on Magnetics, 52(7), Jul. 7, 2016.

International Search Report and Written Opinion for related International Application No. PCT/JP2018/013991, dated Jun. 26, 2018; English translation of ISR provided; 9 pages.

Li Xiang-cheng, et al, Influence of $Fe_2O_3$/SrO ratio and calcining temperature on morphology and magnetic properties of strontium ferrite powder vol. 44, Nov. 30, 2013, pp. 55-58.

* cited by examiner

[FIG. 1]
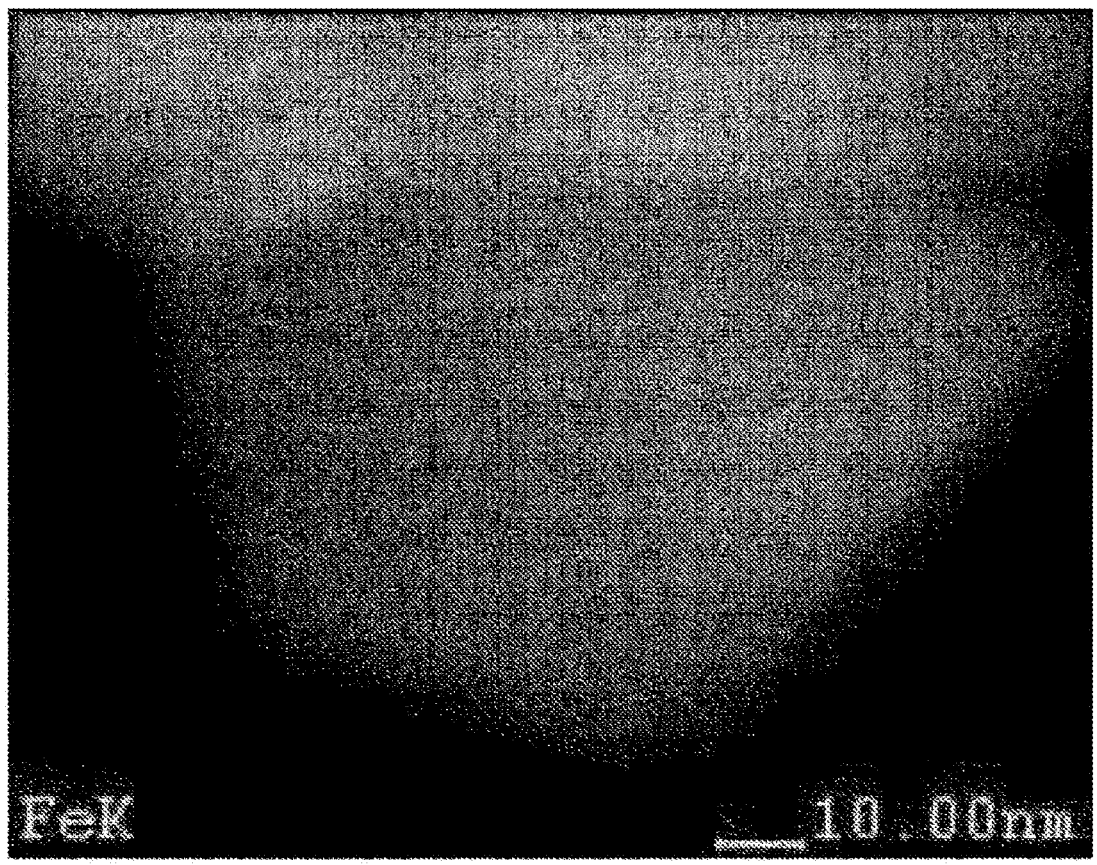

[FIG. 2]
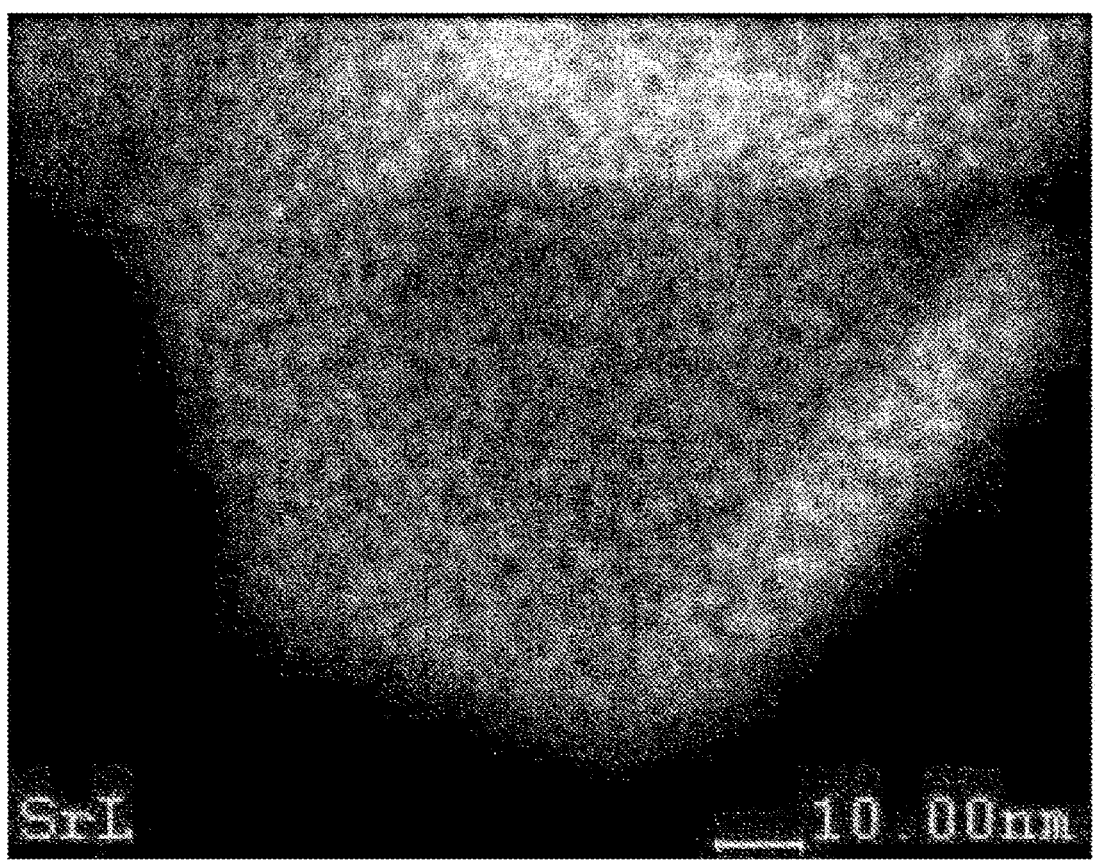

[FIG. 3]
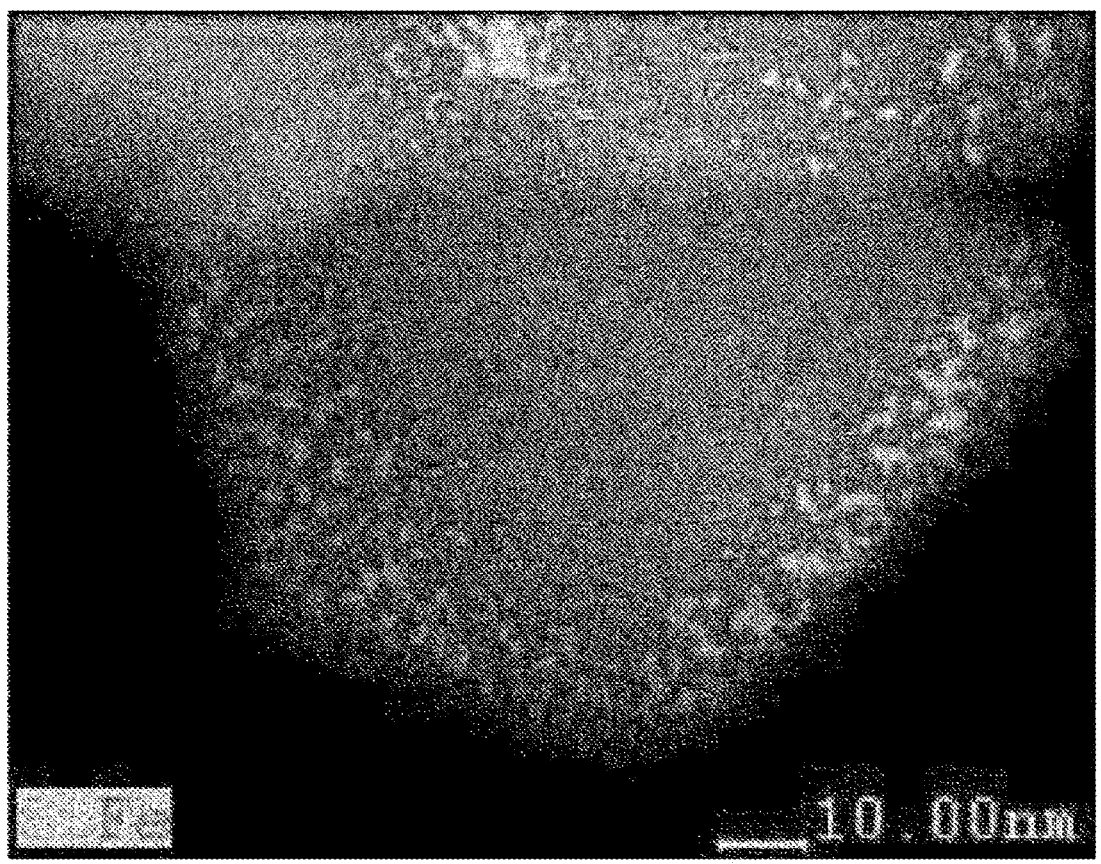

[FIG. 4]
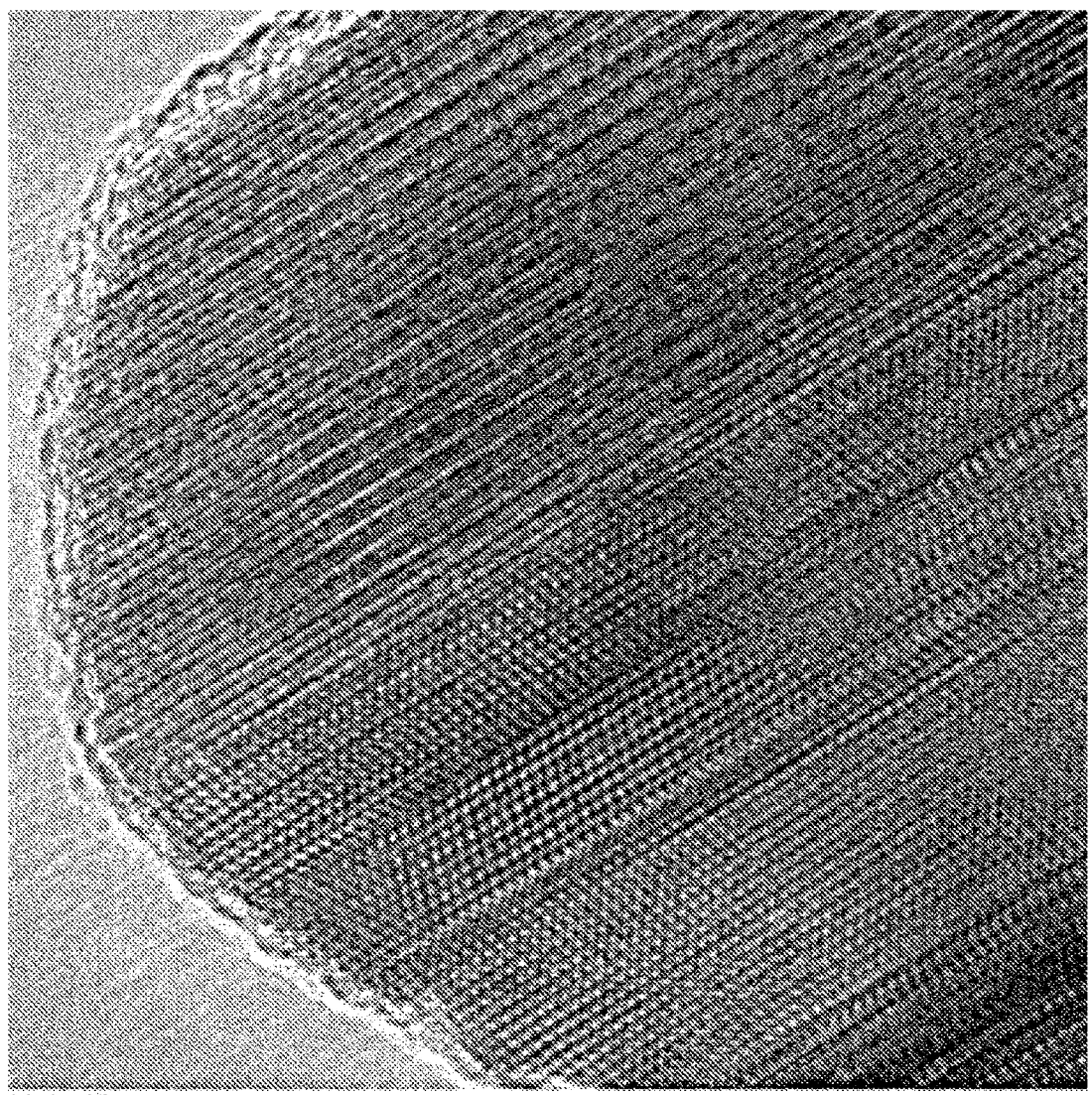

[FIG. 5]
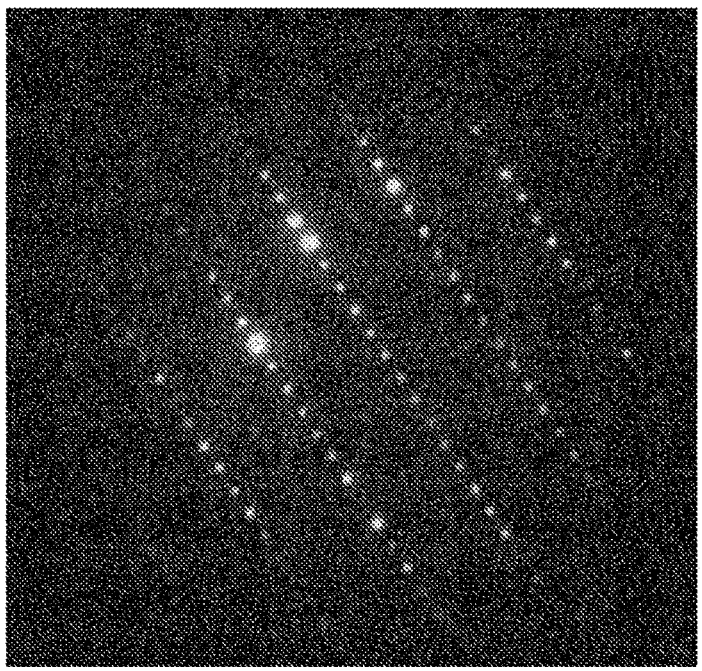
[FIG. 6]
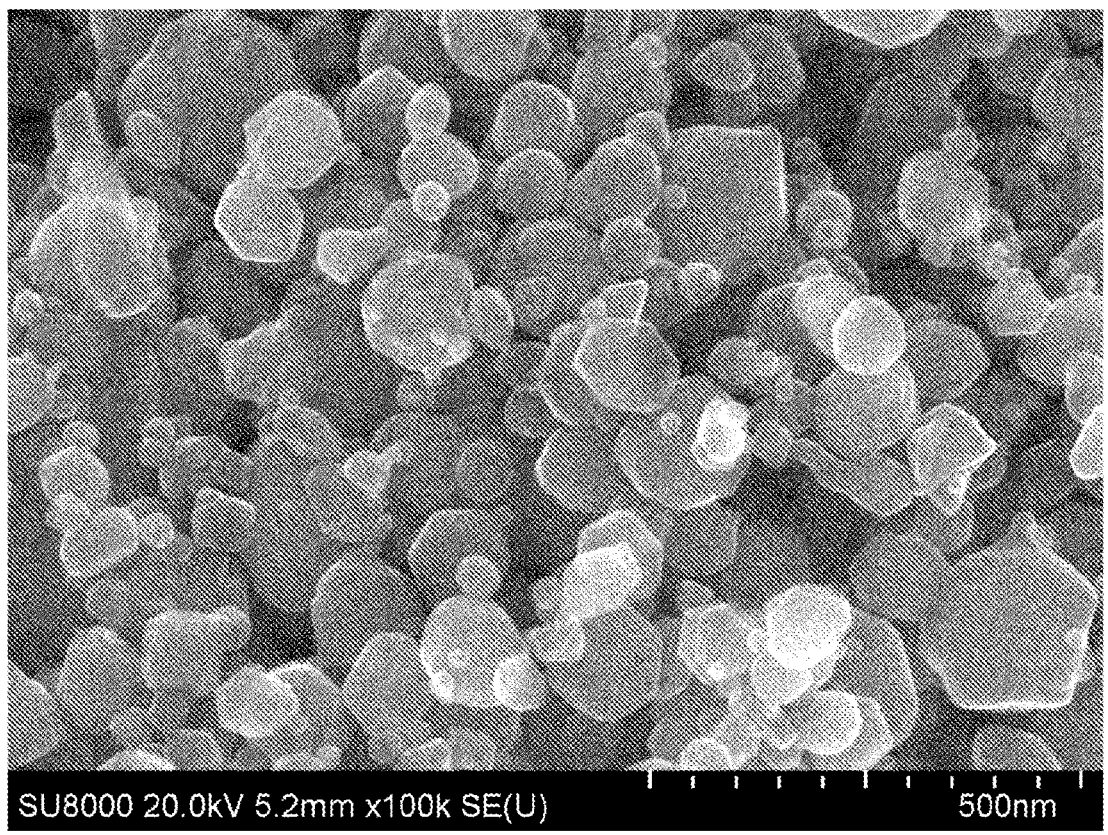

FERRITE POWDER, RESIN COMPOSITION, AND MOLDED BODY

TECHNICAL FIELD

The present invention relates to ferrite powder, a resin composition, and a molded article.

BACKGROUND ART

Generally, a dispersion liquid in which a magnetic powder is dispersed is used for manufacture of a magnetic recording medium (e.g., see Patent Literatures 1 and 2).

Conventionally, however, it was difficult to attain excellent dispersibility of the magnetic powder in the dispersion liquid. In addition, when the dispersibility of the magnetic powder in the dispersion liquid was improved, there arose a problem that the magnetic properties of the magnetic powder decreased (in particular, the coercive force decreased).

A similar problem also exists in magnetic ink in which a magnetic powder is dispersed.

CITATION LIST

Patent Literature

[Patent Literature 1] JP-A-2013-211316
[Patent Literature 2] JP-A-2016-139451

SUMMARY OF INVENTION

Technical Problem

An object of the present invention is to provide ferrite powder having a small particle diameter, high coercive force and excellent dispersibility in a resin or a solvent, to provide a resin composition containing the ferrite powder, and further to provide a molded article including a part manufactured by using the resin composition.

Solution to Problem

The object is achieved by the present invention described below.
[1] A ferrite powder containing a plurality of ferrite particles,
in which the ferrite particles are single crystals having an average particle diameter of 1 nm or more and 2,000 nm or less, and have a polyhedral shape, and
the ferrite particles contain Sr in an amount of 2.0 mass % or more and 10.0 mass % or less, and Fe in an amount of 55.0 mass % or more and 70.0 mass % or less.
[2] A resin composition containing the ferrite powder described in [1].
[3] A molded article including a part formed of the resin composition described in [2].

Advantageous Effects of Invention

The present invention can provide ferrite powder having a small particle diameter, high coercive force and excellent dispersibility in a resin or a solvent, provide a resin composition containing the ferrite powder, and further provide a molded article including a part manufactured by using the resin composition.

BRIEF DESCRIPTION OF DRAWINGS

FIG. 1 It is a view of an EDX analysis result of ferrite particles according to Example 4, particularly showing an analysis result of Fe.

FIG. 2 It is a view of an EDX analysis result of the ferrite particles according to Example 4, particularly showing an analysis result of Sr.

FIG. 3 It is a view of an EDX analysis result of the ferrite particles according to Example 4, particularly combining analysis results of Fe and Sr in the ferrite particles according to Example 4.

FIG. 4 It is an image of a TEM image (magnification of 400,000) of the ferrite particles according to Example 4.

FIG. 5 It is an image of an electron beam diffraction pattern of the ferrite particles according to Example 4.

FIG. 6 It is a SEM image of ferrite powder according to Example 4.

DESCRIPTION OF EMBODIMENTS

Hereinafter, preferred embodiments of the present invention will be described.

(Ferrite Powder)

First, ferrite powder according to the present invention will be described.

The ferrite powder according to the present invention is a ferrite powder containing a plurality of ferrite particles. Further, the ferrite particles are single crystals having an average particle diameter of 1 nm or more and 2,000 nm or less, have a polyhedral shape, and contain Sr in an amount of 2.0 mass % or more and 10.0 mass % or less and Fe in an amount of 55.0 mass % or more and 70.0 mass % or less.

According to such constitutions, it is possible to provide ferrite powder having a small particle diameter, high coercive force and electrical resistance, and excellent dispersibility in a resin or a solvent. In addition, the ferrite powder having such constitutions can be preferably detected by a metal detector. Therefore, it can be preferably applied to a molded article which may be subjected to inspection with a metal detector (molded article that may be used for being detected by a metal detector), or to magnetic ink. In addition, it can also be preferably applied to manufacture of a high density magnetic recording medium, a thin film or the like by utilizing its nano-level size.

In contrast, the excellent effects as described above cannot be obtained when the conditions as described above are not satisfied.

For example, in the case where the average particle diameter of the ferrite particles is less than the above-mentioned lower limit value, aggregation of the ferrite particles is likely to occur, and the dispersibility of the ferrite powder in a resin or a solvent significantly decreases.

In addition, in the case where the average particle diameter of the ferrite particles exceeds the above-mentioned upper limit value, the dispersibility of the ferrite powder in a resin or a solvent significantly decreases, and an undesirable compositional variation is likely to occur in a resin composition or a molded article manufactured by using the resin composition. When the ferrite powder is used for a dispersion liquid (e.g., magnetic ink, etc.) in which ferrite particles are dispersed, the ferrite particles are likely to precipitate and a long-term storage becomes difficult. In addition, in the case where the average particle diameter of the ferrite particles exceeds the above-mentioned upper limit value, undesirable unevenness may be formed on a surface of a molded article due to presence of the ferrite particles in the molded article manufactured by using the ferrite particles. In particular, when the ferrite powder is applied to a flexible printed-wiring board used for wiring, a cable or the like of an electronic device, metal wiring formed on the surface thereof may be damaged by the unevenness.

In addition, the ferrite particles according to the present invention have a form of a single crystal. In the case where the ferrite particles are polycrystalline, when the ferrite particles are used for a magnetic recording medium, there is a possibility that a place with a weak coercive force and a place with a strong coercive force may be created locally during alignment of magnetic moments by magnetization, which may cause problems in data preservation. In addition, for example, when a magnetic domain wall generated by an alternating magnetic field passes through a grain boundary surface, there is a possibility that the magnetic domain wall is anchored at a crystal grain boundary to deteriorate frequency properties.

In addition, in the case where ferrite particles do not have a polyhedral particle shape (polyhedral shape) (e.g., in the case of a hexagonal plate), there is a possibility that the particles have strong anisotropy, and the dispersibility in organic solvents or resin solutions may be poor.

The polyhedral shape is not particularly limited as long as it has 10 or more faces, it preferably has 10 or more faces and 100 or less faces, more preferably 12 or more faces and 72 or less faces, and still more preferably 14 or more faces and 24 or less faces.

The shapes of the ferrite particles can be observed by using, for example, a transmission electron microscope HF-2100 Cold-FE-TEM (manufactured by Hitachi High-Technologies Corporation).

In addition, in the case where the content of Sr in the ferrite particles is less than the above-mentioned lower limit value, the amount of Fe becomes excessive, and the particles contain a relatively large amount of $Fe_2O_3$, resulting in decrease in the coercive force. In addition, it is difficult to form the ferrite particles as a single crystal.

In the case where the content of Sr in the ferrite particles exceeds the above-mentioned upper limit value, the amount of Sr becomes excessive, and the particles contain a relatively large amount of SrO or contain an excess of Sr—Fe oxides other than Sr ferrite, resulting in decrease in various magnetic properties.

In addition, in the case where the content of Fe in the ferrite particles is less than the above-mentioned lower limit value, an excess of Sr—Fe oxides other than Sr ferrite is contained, resulting in decrease in various magnetic properties.

In addition, in the case where the content of Fe in the ferrite particles exceeds the above-mentioned upper limit value, the ferrite powder (ferrite particles) is likely to be oxidized in a manufacture process, and various magnetic properties decrease.

In the present invention, the particle diameter of a ferrite particle is a horizontal Feret diameter determined from a SEM image photographed by using a scanning electron microscope, and the average particle diameter of the ferrite particles refers to an average value of the particle diameters (horizontal Feret diameters) obtained by 100 or more ferrite particles.

For example, SU-8020 manufactured by Hitachi High-Technologies Corporation, and the like can be used as a scanning electron microscope. The magnification during photographing the SEM image can be set to 10 to 200,000. For example, image analysis software such as Image-Pro PLUS manufactured by Media Cybernetics can be used for image analysis of the SEM image.

In addition, the contents of metal elements constituting the ferrite particles can be measured as follows.

That is, an aqueous solution is prepared by weighing 0.2 g of ferrite powder, and adding thereto a mixture prepared by adding 20 mL of 1 N hydrochloric acid and 20 mL of 1 N nitric acid to 60 mL of pure water, followed by heating to completely dissolve the ferrite powder (ferrite particles), and the aqueous solution is measured by using an ICP analyzer (e.g., ICPS-1000IV manufactured by Shimadzu Corporation), whereby the contents of the metal elements can be determined.

The average particle diameter of the ferrite particles may be 1 nm or more and 2,000 nm or less, and is preferably 1 nm or more and 800 nm or less, and more preferably from 1 nm or more and 300 nm or less.

Accordingly, the effects described above are more prominently exhibited.

The ferrite particles constituting the ferrite powder according to the present invention may have a polyhedral particle shape. The spherical ratio (average spherical ratio) of the ferrite particles is preferably 1.02 or more and 1.43 or less, more preferably 1.05 or more and 1.42 or less, and still more preferably from 1.11 or more and 1.33 or less.

It is considered that the ferrite particles having a polyhedral shape are generated when Sr component contained in a raw material serves as a flux when it volatilizes at high-temperature condition during thermal-spraying firing. Therefore, even if similar operation is performed by using a raw material containing no Sr, ferrite particles having a polyhedral shape are not generated or only few ones are generated. In addition, in the case where the firing temperature is low, Sr hardly functions as a flux and thus it is difficult to form a polyhedral shape.

The spherical ratio can be determined as follows.

First, the ferrite particles are photographed at magnification of 200,000 by using a scanning electron microscope (FE-SEM (e.g., SU-8020 manufactured by Hitachi High-Technologies Corporation, etc.)). Then, a circumscribed circle diameter and an inscribed circle diameter of the ferrite particle are determined from the photographed SEM image, and the ratio therebetween (circumscribed circle diameter/ inscribed circle diameter) is determined as the spherical ratio. When the two diameters are identical, that is, the ferrite particles are true spheres, the ratio therebetween will be one. As the average spherical ratio, for example, an average value of the spherical ratios obtained by determining 100 ferrite particles randomly selected from the ferrite powder can be adopted.

The content of Sr in the ferrite particles may be 2.0 mass % or more and 10.0 mass % or less, and is preferably 2.5 mass % or more and 9.5 mass % or less, and more preferably 4.0 mass % or more and 9.0 mass % or less.

Accordingly, the effects described above are more prominently exhibited. In addition, particularly high electrical resistance can be stably obtained over a wide range of from low applied voltage to high applied voltage. Therefore, for example, in the case where the ferrite powder is applied to a flexible printed wiring board or the like, occurrence of electric current leakage can be prevented more effectively and durability can be improved.

The content of Fe in the ferrite particles may be 55.0 mass % or more and 70.0 mass % or less, and is preferably 57.0 mass % or more and 69.0 mass % or less, and more preferably 58.0 mass % or more and 68.0 mass % or less.

Accordingly, the effects described above are more prominently exhibited.

The ferrite particles may contain components (elements) other than Fe, Sr and O. Examples of such components include Mn, Mg, Ti, Si, Cl, Ca, and Al.

Here, the content of the components (elements) other than Fe, Sr and O in the ferrite particles as above is preferably 2.0 mass % or less, more preferably 1.5 mass % or less, and still more preferably 0.8 mass % or less.

In particular, it is preferable that Sr is unevenly distributed on a surface of the ferrite particle.

Accordingly, for example, surface treatment on ferrite particles can be more preferably performed with a surface treatment agent (in particular, a silane coupling agent) as described in detail below, agglomeration of the ferrite particles can be prevented more effectively, and fluidity and handleability of the ferrite particles and a resin composition containing the ferrite particles can be further improved. In addition, the dispersibility of the ferrite particles in the resin composition and in a molded article can be further improved. In addition, surface treatment with the surface treatment agent can be more uniformly performed on each part of the ferrite particles as base particles. Such effects are more remarkably exhibited when Sr is unevenly distributed on the surface of the ferrite particle in a state of an oxide (e.g., SrO).

In addition, in the case where Sr is unevenly distributed on the surface of the ferrite particle in a state of an oxide (e.g., SrO), the electrical resistance of the ferrite powder (ferrite particles) and the electrical resistance of the molded article containing the ferrite powder (ferrite particles) can be further increased.

The distribution of constituent elements in the ferrite particles can be determined as the strength of the constituent elements relative to moving distance of an electron ray swept from the outer surface of ferrite particle to the inside thereof by performing an energy dispersive X-ray (EDX) analysis on an image (STEM image) that is obtained by observing the ferrite particles by a scanning transmission electron microscope. For example, EDAX Octane T Ultra W (manufactured by AMETEK Corporation) can be used for the analysis.

The ferrite particles may be subjected to surface treatment.

Examples of the surface treatment agent used for the surface treatment of particles include silane coupling agents, phosphoric acid compounds, carboxylic acids, fluorine compounds, titanate coupling agents, aluminate coupling agents, and the like.

In particular, in the case where a surface treatment with a silane coupling agent has been applied to the ferrite particles, agglomeration of the ferrite particles can be prevented more effectively, and fluidity and handleability of the ferrite particles and a resin composition containing the ferrite particles can be further improved. In addition, the dispersibility of the ferrite powder in the resin composition and in a molded article can be further improved. Furthermore, in the case where a surface treatment with a silane coupling agent has been applied to the ferrite particles, the electrical resistance of the ferrite powder (ferrite particles) can be further increased. In addition, from the relationship of affinity between the silane coupling agent and the ferrite particles described above, a surface treatment with the silane coupling agent can be more uniformly performed on each part of the ferrite particles as the base particles.

For example, a silane compound having a silyl group and a hydrocarbon group can be used as the silane coupling agent. The silane coupling agent preferably has an alkyl group having a carbon number of 8 or more and 10 or less as the above-mentioned alkyl group.

Accordingly, aggregation of the ferrite particles can be prevented more effectively, and fluidity and handleability of the ferrite particles and a resin composition containing the ferrite particles can be further improved. In addition, the dispersibility of the ferrite powder in the resin composition and in a molded article can be further improved. In addition, from the relationship of affinity between the silane coupling agent and the ferrite particles described above, a surface treatment with the silane coupling agent can be more uniformly performed on each part of the ferrite particles as the base particles. Examples of the silane coupling agent that has an alkyl group having a carbon number of 8 or more and 10 or less include decyltrimethyoxysilane, n-octyltriethoxysilane and the like.

In addition, in the case where a surface treatment with a carboxylic acid has been performed on the ferrite particles, affinity to an epoxy resin can be further improved, and dispersion stability of the ferrite particles in a resin composition containing the epoxy resin can be further improved. In addition, undesired compositional variation of the ferrite particles in a molded article containing a cured product of the epoxy resin can be prevented more effectively, and the mechanical strength and the like of the molded article can be further improved.

Examples of the phosphoric acid compound include lauryl phosphate ester, lauryl-2-phosphate ester, steareth-2-phosphate, phosphoric acid ester of 2-(perfluorohexyl) ethyl phosphonic acid, and the like.

As the carboxylic acid, for example, a compound (fatty acid) having a hydrocarbon group and a carboxyl group can be used. Specific examples of such compounds include decanoic acid, tetradecanoic acid, octadecanoic acid, cis-9-octadecenoic acid, and the like.

Examples of the fluorine compound include compounds having a structure in which at least a part of hydrogen atoms contained in the silane coupling agents, phosphoric acid compounds and carboxylic acids as described above with a fluorine atom (fluorine silane compounds, fluorine phosphoric acid compounds, and fluorine-substituted fatty acids), and the like.

The ferrite powder according to the present invention has the constitution described above, so that an appropriate saturation magnetization can be obtained.

Specifically, the saturation magnetization of the ferrite powder according to the present invention is preferably 15 $Am^2/kg$ or more and 80 $Am^2/kg$ or less, more preferably 20 $Am^2/kg$ or more and 70 $Am^2/kg$ or less, and still more preferably 25 $Am^2/kg$ or more and 65 $Am^2/kg$ or less, by VSM measurement when a magnetic field of 10 K·1000/4πA/m is applied.

The ferrite powder satisfying such conditions is preferably used, for example, by adding it to a magnetic metal powder used as a magnetic core material. In addition, the ferrite particles can be preferably made to unevenly distribute on a desired part of a molded article by applying a magnetic field during manufacture of the molded article, and the manufactured molded article can be preferably adsorbed by a magnetic force by applying a magnetic field thereto. In particular, the saturation magnetic flux density after molding hardly decreases when being added to a magnetic metal powder.

In contrast, in the case where the saturation magnetization is less than the lower limit value, there is a possibility that it may be difficult to unevenly distribute the ferrite particles to a desired part of the molded article or to adsorb the manufactured molded article by applying a magnetic field. In addition, the saturation magnetization hardly exceeds the upper limit value in the constitution as described above.

The residual magnetization of the ferrite powder according to the present invention by VSM measurement when a magnetic field of 10 K·1000/4πA/m is applied is preferably 2.0 Am²/kg or more and 35 Am²/kg or less, more preferably 3.0 Am²/kg or more and 30 Am²/kg or less, and still more preferably 5.0 Am²/kg or more and 25 Am²/kg or less.

Accordingly, while the dispersibility of the ferrite powder in a resin or a solvent is further improved, the energy product (=residual magnetization×coercive force) can be increased. In contrast, in the case where the residual magnetization is less than the above-mentioned lower limit value, the energy product is reduced even if the coercive force is a similar level when a magnetic recording medium is manufactured. Accordingly, there is a possibility that the recording state may be changed by the external magnetic field. In addition, in the case where the residual magnetization exceeds the above-mentioned upper limit value, there is a possibility that the dispersibility of the ferrite powder in a resin or a solvent may be reduced.

The coercive force of the ferrite powder by VSM measurement when a magnetic field of $10 \text{ K} \cdot 1000/4\pi \text{A/m}$ is applied is preferably 30 kA/m or more and 400 kA/m or less, more preferably 50 kA/m or more and 350 kA/m or less, and still more preferably 80 kA/m or more and 300 kA/m or less.

Accordingly, for example, the property as a magnetic recording medium (e.g., magnetic tape, etc.) can be further improved. In contrast, in the case where the coercive force is less than the above-mentioned lower limit value, there is a possibility that the record may not be read well when used as a magnetic recording medium. In addition, the case where the coercive force exceeds the above upper limit value does not occur in the combination of elements described in the present invention.

The saturation magnetization, the residual magnetization and the coercive force can be determined, for example, as follows. That is, first, ferrite powder (ferrite particles) to be a target is packed in a cell having an inner diameter of 5 mm and a height of 2 mm, which is set in a vibrating sample magnetic measurement device. Next, an applied magnetic field is applied and swept to $10 \text{ K} \cdot 1000/4\pi \text{A/m}$, and then the applied magnetic field is reduced to create a hysteresis curve. The saturation magnetization, the residual magnetization and the coercive force can be obtained from data of the curve. For example, VSM-C7-10A (manufactured by Toei Industry Co., Ltd.), and the like can be used as a vibrating sample magnetic measurement device.

The ferrite powder according to the present invention has the constitution described above, so that a sufficiently high powder resistance (electrical resistance) can be obtained. Accordingly, the eddy current loss can be reduced when it is mixed with the metal powder and molded to be used, and there is a possibility that the ferrite powder can be used even under higher frequency operation. In addition, for example, in the case where the ferrite powder is applied to a printed wiring board, occurrence of electric current leakage can be prevented and durability can be ensured.

The electrical resistance of the ferrite powder can be evaluated, for example, by the volume resistivity in the case where the electric field strength is set as 5,000 V/cm (650 V in the case of 1.3 mm in height).

The volume resistivity of the ferrite powder according to the present invention in the case where the electric field strength is set as 5,000 V/cm is preferably from $1 \times 10^7$ Ω·cm or higher, more preferably from $1 \times 10^8$ Ω·cm or higher, and still more preferably from $1 \times 10^9$ Ω·cm or higher.

The electrical resistivity of the ferrite powder can be determined, for example, as follows. That is, a fluororesin-made cylinder having a cross-sectional area of 1.77 cm² is filled with a sample (ferrite powder) up to the height of 1.3 mm, then electrodes are attached on two ends, and 1 kg of weight is placed further thereon. In this state, measurement voltage is applied stepwise from 50 V to 1,000 V in 50 V steps every 5 seconds to the electrodes by using a 6517A insulation resistance tester manufactured by Keithley Corporation, and a current value after 5 seconds of each step is measured. The volume resistivity can be calculated from the measured current values and the applied voltage.

The constituent particles (ferrite particles) of the ferrite powder according to the present invention preferably has a BET specific surface area of 9.0 m²/g or larger and 28 m²/g or smaller, more preferably 10 m²/g or larger and 20 m²/g or smaller, and still more preferably 11 m²/g or larger and 14 m²/g or smaller.

Accordingly, it becomes difficult to settle out in a solvent or in a resin solution, and can provide a dispersion liquid having excellent dispersion stability for a longer period of time. In contrast, in the case where the BET specific surface area is less than the above-mentioned lower limit value, there is a possibility that the ferrite particles tend to settle out in the dispersion liquid containing the ferrite particles, which may make long-term storage difficult.

The BET specific surface area can be determined by a measurement using a specific surface area measurement device (e.g., Macsorb HM model-1208, (manufactured by Mauntec Corporation)).

The ferrite powder according to the present invention may contain a plurality of ferrite particles satisfying the above conditions, and may further contain other particles (particles that do not satisfy the above conditions). In such a case, the content of other particles occupied in the ferrite powder is preferably 10 mass % or less, more preferably 3.0 mass % or less, and still more preferably 0.5 mass % or less. Accordingly, the effects as described above are exhibited more prominently.

(Method of Producing Ferrite Powder)

Next, a method for producing the ferrite powder according to the present invention will be described.

The ferrite powder according to the present invention may be manufactured by any method, and can be preferably manufactured, for example, by a method described below.

That is, the ferrite powder according to the present invention can be preferably manufactured by, for example: thermally spraying a ferrite raw material containing Fe and Sr in the atmosphere for ferritization; rapidly cooling and solidifying; and then, selectively recovering particles (ferrite particles) having a particle diameter within a predetermined range.

Accordingly, ferrite particles satisfying the conditions including the shape, the particle diameter and the crystal structure as described above, can be efficiently manufactured. In addition, in the manufacture process, unlike a wet manufacturing method using an acid or an alkali, it is possible to effectively prevent impurities or the like derived from an acid or an alkali from remaining in the finally obtained ferrite powder, and to further improve durability and reliability of the ferrite powder, the resin composition manufactured by using the ferrite powder, and the molded article. In addition, in the wet manufacturing method using an acid or an alkali, it is required to strictly adjust pH of the liquid in the manufacture process, and subtle changes in conditions are likely to cause large differences in the properties of the manufactured particles. However, since condition setting is easy in the method as described above, ferrite particles having stable properties can be preferably manufactured.

The method of preparing the above-mentioned ferrite raw material is not particularly limited, and a conventionally and commonly known method can be adopted. For example, a dry method may be used and a wet method may be used.

The following method may be mentioned as an example of the method of preparing the ferrite raw material (granulated product). That is, first, appropriate amounts of an Fe raw material and an Sr raw material are weighed so as to give an objective ferrite constitution, then water is added thereto, followed by pulverizing to prepare slurry. Then, the prepared slurry is granulated by a spray dryer, and is pulverized and classified as necessary, to prepare a granulated product having a predetermined particle diameter.

Examples of classification methods include air classification, mesh filtration method, sedimentation method, classification using various sieves, and the like.

An average particle diameter of the granulated products is not particularly limited, and is preferably 0.5 µm or larger and 30 µm or smaller.

The average particle diameter can be obtained, for example, by measuring a particle diameter D50 at which the accumulation in the volume-based particle size distribution is 50%, by a laser diffraction particle size distribution analyzer (LA-950, Horiba, ltd.).

Accordingly, during thermal-spraying, the formation of single-crystal particles having a relatively small particle diameter can proceed more preferably, and the ferrite powder satisfying the conditions as described above can be manufactured more efficiently. Moreover, fine pore volume, average fine pore diameter, BET specific surface area, and the like of the finally obtained ferrite particles can be more preferably adjusted. In addition, treatment such as classification in a later step can be omitted or simplified, and the productivity of ferrite powder can be further improved. Furthermore, the proportion of particles to be removed by classification in the later step can be further reduced, and the yield of the ferrite powder can be further improved.

The above-mentioned slurry preferably has a viscosity of 0.3 poise (P) or higher and 5 poise or lower, and more preferably 0.5 poise or higher and 4 poise or lower. It should be noted that 10 P=1 Pa·s.

Accordingly, handleability of the slurry can be further improved, and spraying and drying of the slurry can be performed more preferably. As a result, a granulated product with objective desired size and shape can be manufactured with more excellent productivity.

It should be noted that in the present description, the viscosity refers to a value measured at 25° C. by using a B-type viscometer (e.g., visco tester, manufactured by Rion Co., Ltd.).

In addition, another example of a method of preparing a ferrite raw material (granulated product) includes a method in which, for example, a ferrite raw material having a adjusted composition is mixed and subjected to dry pulverizing, each raw material is pulverized and dispersed, and the mixture is granulated with a granulator and classified to prepare a granulated product having a predetermined particle diameter.

The granulated product prepared as described above is thermally sprayed and converted into a ferrite in the atmosphere. A mixed gas containing combustion gas and oxygen gas can be used for thermal-spraying.

The mixing ratio of the combustion gas to oxygen gas in the mixed gas is preferably 1:3.5 or more 1:6.0 or less in terms of volume ratio. In the case where the ratio of oxygen gas in the mixed gas is less than the lower limit value, melting may become insufficient in some cases. In addition, in the case where the ratio of oxygen gas in the mixed gas exceeds the upper limit value, ferritization becomes difficult.

For example, oxygen gas can be used at a ratio of 35 $Nm^3/h$ or more and 60 $Nm^3/h$ or less to 10 $Nm^3/h$ of the combustion gas.

As the combustion gas used for the thermal-spraying, for example, propane gas, propylene gas, acetylene gas, or the like can be used, and particularly, propane gas can be used preferably.

In addition, for example, granulated product-transporting gas may be used to transport the granulated product into combustible gas combustion. For example, nitrogen gas, oxygen gas, air, or the like can be used as the granulated product-transporting gas.

The flow rate of the granulated product to be transported is preferably 20 m/s or higher and 60 m/s or lower.

In addition, the thermal-spraying is preferably performed at a temperature of 1,000° C. or higher and 3,500° C. or lower, and more preferably at a temperature of 1,500° C. or higher and 3,500° C. or lower.

In the case where the above-mentioned conditions are satisfied, the formation of single-crystal particles having a relatively small particle diameter can proceed more preferably, and the ferrite powder satisfying the conditions as described above can be manufactured more efficiently. Moreover, the fine pore volume, average fine pore diameter, BET specific surface area, and the like of ferrite particles constituting the finally obtained ferrite powder can be more preferably adjusted. In addition, treatment such as classification in a later step can be omitted or simplified, and the productivity of ferrite powder can be further improved. Furthermore, the proportion of particles to be removed by classification in the later step can be further reduced, and the yield of the ferrite powder can be further improved.

Subsequently, the ferrite particles formed through the main-firing by thermal-spraying are transported in the atmosphere on airflow supplied by air to perform rapid-cooling and solidifying, and then, ferrite particles in a predetermined particle diameter range are collected and recovered.

The collection can be performed by a method in which the rapidly cooled and solidified ferrite particles are transported on the airflow supplied by air, and by utilizing the fact that particles having a large particle diameter fall in the middle of airflow transportation while the other particles are transported by airflow to an downstream side, ferrite particles having an average particle diameter in the above-mentioned range is collected by a filter provided on the downstream side of the airflow.

When the flow rate during the airflow transportation is set to 20 m/s or higher and 60 m/s or lower, particles having the large particle diameter can be made to drop with particularly high selectivity, and the ferrite particles in a predetermined particle diameter range can be recovered more efficiently. In the case where the flow rate is too low, even particles with a relatively small particle diameter fall in the middle of the airflow transportation. Accordingly, the average particle diameter of ferrite particles collected at the downstream side of the airflow becomes too small, or the absolute amount of the ferrite particles collected at the downstream side of the airflow is reduced, causing decrease in the productivity. In contrast, in the case where the flow rate is too high, even particles having a relatively large particle diameter are transported to the downstream side. Accordingly, the average particle diameter of the ferrite particles recovered at the downstream side of the airflow becomes too large.

Then, the recovered ferrite particles may be classified as necessary.

Accordingly, ferrite particles satisfying the preferred conditions as described above can be obtained more preferably.

A conventionally known air classification, mesh filtration method, sedimentation method, or the like can be used as a classification method. In addition, particles having a large particle diameter may be removed by a cyclone or the like.

In addition, after the main-firing treatment, the ferrite particles may be subjected to a surface treatment. Accordingly, for example, ferrite particles having a surface layer can be preferably formed.

The amount of a surface treatment agent used depends on the BET specific surface area of the ferrite particles as the base particles, and is preferably 0.05 parts by mass or more and 8 parts by mass or less relative to 100 parts by mass of the ferrite particles (base particles).

(Application of Ferrite Powder)

The application of the ferrite powder according to the present invention is not particularly limited. Examples thereof include: a tape for a magnetic recording medium, a flexible printed wiring board, an electromagnetic shielding material, a pigment, a power generation member (e.g., magnetic core material), a filler (in particular, magnetic fillers), articles to be applied to a metal detector (e.g., articles that are used in manufacturing sites of food, medicine, etc., and should be prevented from contamination as a foreign matter), additives of a powder magnetic core, and the like. In addition, the ferrite powder according to the present invention may be contained in a cloth (e.g., a woven cloth, a non-woven cloth, etc.) or in the interior or on a surface of a fiber, to be used.

(Resin Composition)

Next, a resin composition according to the present invention will be described.

The resin composition according to the present invention contains the ferrite powder according to the present invention.

The resin composition according to the present invention can be preferably used for manufacture of a molded article described below in detail. More specifically, it can be preferably used for the manufacture of a molded article which is high in saturation magnetization, coercive force and electrical resistance. In addition, since the ferrite powder can be favorably dispersed in the resin composition, and aggregation of ferrite particles and undesirable compositional variations can be effectively prevented, it can be preferably used for the manufacture of a molded article in which undesired compositional variations or the like are effectively prevented.

The ferrite powder may be contained in the resin composition according to the present invention in any form, and is preferably dispersed in a resin material.

Accordingly, handleability of the resin composition can be further improved, and molding of the molded article described in detail below can be more preferably performed. In addition, occurrence of undesirable variations in the content of ferrite particles in each part of the molded article can be effectively prevented.

The content of the ferrite powder in the resin composition is not particularly limited, and is preferably 5.0 mass % or more and 90 mass % or less, and more preferably 7.0 mass % or more and 88 mass % or less.

Accordingly, moldability of the molded article can be further improved, and toughness, strength, reliability, and the like of the molded article can be further improved. The magnetic properties, electrical insulation properties and the like of the molded article can be further improved.

For example, various thermoplastic resins, various curable resins, and the like can be used as a resin material contained in the resin composition.

More specific examples thereof include: polyolefins such as polyethylene, polypropylene, poly-(4-methylpentene-1), ethylene-propylene copolymers, and cyclic polyolefins; modified polyolefins; polystyrene; butadiene-styrene copolymers; acrylonitrile-butadiene-styrene copolymers (ABS resin); acrylonitrile-styrene copolymers (AS resin); polyvinyl chloride; polyvinylidene chloride; ethylene-vinyl acetate copolymers (EVA); polyamides (e.g., nylon 6, nylon 46, nylon 66, nylon 610, nylon 612, nylon 11, nylon 12, nylon 6-12, nylon 6-66); polyimides; polyamideimides; acrylic resins such as polymethyl methacrylate; polycarbonates (PC); ionomers; polyvinyl alcohol (PVA); ethylene-vinyl alcohol copolymers (EVOH); polyesters such as polyethylene terephthalate (PET), polybutylene terephthalate (PBT), polycyclohexane terephthalate (PCT), polyarylates, and aromatic polyesters (liquid crystal polymer); polyethers; polyacetals (POM); polyphenylene oxides; modified polyphenylene oxides; polyether ketones (PEK); polyether ether ketones (PEEK); polyether imides; polysulfones; polyether sulfones; polyphenylene sulfides; fluororesins such as polytetrafluoroethylene, and polyvinylidene fluoride; rubber materials such as silicone rubber, isoprene rubber, butadiene rubber, nitrile rubber, and natural rubber; various thermoplastic elastomers such as styrene type, polyolefin type, polyvinyl chloride type, polyurethane type, polyester type, polyamide type, polybutadiene type, trans polyisoprene type, fluorinated rubber type, and chlorinated polyethylene type; epoxy resins; phenol resins; yulia resins; melamine resins; unsaturated polyesters; silicone resins; polyurethanes; and the like, and copolymers, blends and polymer alloys mainly based on these. One kind or two or more kinds thereof can be used in combination.

Among them, the resin material contained in the resin composition preferably contains one kind or two or more kinds selected from the group consisting of polyethylene, polypropylene, polyvinyl chloride, polyvinylidene chloride, polyvinyl alcohol (PVA), fluororesins, silicone rubber, butadiene rubber, thermoplastic elastomers, epoxy resins, and silicone resins.

Accordingly, the dispersion stability of the ferrite powder in the resin composition can be further improved, and the moldability of the molded article can be further improved. In addition, toughness, strength, reliability and the like of the molded article can be further improved.

In particular, in the case where the ferrite particles are subjected to a surface treatment with a silane-coupling agent, adhesion to various resins is improved and therefore, the dispersion stability of the ferrite powder in the resin composition can be further improved and the moldability of the molded article can be further improved.

In addition, the resin material contained in the resin composition may have a composition different from that of the resin material contained in a molded article manufactured by using the resin composition. For example, the resin material contained in the resin composition may be a precursor (e.g., monomer, dimer, trimer, oligomer, prepolymer, etc.) of the resin material contained in the final molded article.

The content of the resin material in the resin composition is not particularly limited, and is preferably 8.0 mass % or more and 95 mass % or less, and more preferably 10 mass % or more and 90 mass % or less.

Accordingly, moldability of the molded article can be further improved, and toughness, strength, reliability and the like of the molded article can be further improved. In addition, the content of ferrite powder can be sufficiently high, and the magnetic properties, electrical insulation properties and the like of the molded article can be further improved.

In contrast, in the case where the content of the resin material in the resin composition is less than the lower limit value, there is a possibility that moldability of the molded article may be decreased, and toughness, strength, reliability, and the like of the molded article may be decreased.

In addition, in the case where the content of the resin material in the resin composition exceeds the upper limit value, the content of the ferrite powder is relatively reduced, and there is a possibility that it may be difficult to sufficiently improve the magnetic properties, electrical insulation properties and the like of the molded article depending on the composition or the like of the ferrite powder.

The resin composition according to the present invention may contain the ferrite powder of the present invention and the resin material, and may further contain components other than them (other components).

Examples of such components (other components) include various colorants such as pigments and dyes; various fluorescent materials; various luminous materials; various phosphorescent materials; solvents; infrared-absorbing materials; ultraviolet absorbers; dispersants; surfactants; polymerization initiators; polymerization accelerators; cross-linking agents; polymerization inhibitors; sensitizers; plasticizers; slip agents (leveling agents); penetration enhancers; humectants (moisturizers); antistatic agents; fixers; preservatives; antifungal agents; antioxidants; chelating agents; pH adjusters; thickeners; fillers such as alumina, silica, titanium oxide, magnesium oxide, antimony oxide, calcium oxide, zinc oxide, aluminum hydroxide, magnesium hydroxide, calcium carbonate, potassium titanate, glass fiber, carbon fiber, gypsum fiber, metal fiber, metal particles, graphite, talc, clay, mica, wollastonite, zonotrite, hydrotalcite, and zeolite; antiflocculating agents; defoamers; foaming agents; and the like.

The resin composition according to the present invention may be any form. Examples of the form of the resin composition include powder, pellet, dispersion liquid, slurry, gel, and the like, and pellet is preferred.

Accordingly, handleability of the resin composition can be further improved, and manufacture of the molded article in which the resin composition is used can be more preferably performed. In addition, the storage stability of the resin composition can be further improved, and the deterioration or the like of the constituent components of the resin composition during storage or the like can be more effectively prevented.

In the case where the resin composition is pellet, the volume average particle diameter thereof is preferably 1 mm or larger and 10 mm or smaller, and more preferably 2 mm or lager and 7 mm or smaller.

Accordingly, handleability of the resin composition can be further improved, and manufacture of the molded article in which the resin composition is used can be more preferably performed.

The resin composition according to the present invention can be manufactured, for example, by mixing the ferrite powder according to the present invention with the resin material. The mixing of the ferrite powder and the resin material can be more preferably performed, for example, by using a mixing device (kneading device) such as a stirring kneader such as a planetary mixer, a two-axis mixer, a kneader, a bunbury mixer, and an oven roll, a single-screw extruder, and a twin-screw extruder.

In addition, for example, other components as described above may be further used as necessary in the mixing.

In addition, the mixing process may be divided into, for example, a plurality of steps.

(Molded Article)

Next, a molded article according to the present invention will be described.

The molded article according to the present invention includes a part formed of the resin composition according to the present invention.

Accordingly, a molded article that is high in the saturation magnetization, coercive force and electrical resistance can be obtained. In addition, a molded article in which undesired compositional variations and the like are effectively prevented can be obtained. In addition, the strength, durability and the like of the molded article can be further improved by containing the ferrite powder according to the present invention therein. Therefore, for example, when an external force such as a tension force or a bending force is applied, and particularly when a large external force is applied or when the external force is repeatedly applied, a part of the molded article is more effectively prevented from detaching due to being cut or the like.

The molded article according to the present invention may contain the ferrite powder on at least a part thereof, and may have, for example, an area containing no ferrite powder.

More specifically, for example, the molded article may have a first region that is a region containing the ferrite powder according to the present invention (a region formed by using the resin composition according to the present invention), and a second region that is a region that does not contain the ferrite powder according to the present invention (e.g., a region formed by a material other than the resin composition according to the present invention).

In particular, the molded article preferably at least contains the ferrite powder according to the present invention in the vicinity of the surface thereof.

More specifically, the molded article preferably contains the ferrite powder according to the present invention in a region within 1.0 mm from the surface in the thickness direction, and more preferably contains the ferrite powder according to the present invention in a region within 0.5 mm from the surface in the thickness direction.

Accordingly, the properties (e.g., magnetic properties, electrical properties, etc.) of the ferrite powder in the molded article can be more effectively exhibited.

Such a molded article can be preferably manufactured, for example, by applying a magnetic field from a direction in which a surface of the molded article is to be formed when the molded article is molded (in a state where the resin material is softened or melted). In particular, in the case where the molded article is relatively thick, the ferrite described above can be unevenly distributed in the vicinity of the surface of the molded article, and the effects as described above can be more significantly exhibited.

The content of the ferrite powder according to the present invention in the molded article according to the present invention varies depending on the application or the like of the molded article, and is preferably 2.0 mass % or more and 20 mass % or less, and more preferably 2.5 mass % or more and 18 mass % or less.

Accordingly, toughness, strength, reliability and the like of the molded article can be further improved. In addition, the magnetic properties, electrical insulation properties and the like of the molded article can be further improved.

In the case where the molded article includes a part that does not contain the ferrite powder according to the present invention in addition to the part containing the ferrite powder according to the present invention, the conditions of the content as described above are preferably satisfied in the part containing the ferrite powder according to the present invention.

Various molding methods can be used as a method for producing the molded article, and examples thereof include molding methods such as injection molding (insert molding, multicolor molding, sandwich molding, injection molding, etc.), compression molding methods, extrusion methods, inflation molding methods, T-die film molding methods, lamination molding methods, blow molding methods, hollow molding methods, compression molding methods, and calendar molding methods, various coating methods, stereolithographies, three-dimensional additive manufacturing methods, and the like.

In addition, in the case where the resin composition contains a curable resin, a curing reaction of the curable resin is performed. The curing reaction varies depending on the types of the curable resin, and can be performed by heating or irradiation of energy rays such as ultraviolet light.

In addition, when the molded article is manufactured, a plurality of types of resin compositions (e.g., a plurality of types of the resin compositions according to the present invention) may be used in combination.

In addition, in the case where the molded article includes: a base part formed by using a composition that does not contain the ferrite powder according to the present invention; and a surface layer provided on the base part and formed by using a composition that contains the ferrite powder according to the present invention, it may be manufactured in such a manner that the surface layer is formed by using a coating method such as dipping or brush coating, one of various printing methods such as an ink jet method, or the like on the base part manufactured by the method as described above or a method such as casting, forging, powder injection molding (PIM) or the like.

In addition, the molded article may be magnetized during the molding thereof. Accordingly, the ferrite powder can be unevenly distributed in the area in the vicinity of the surface of the molded article preferably.

In addition, the molded article can be manufactured by subjecting the molded article obtained by the molding method as described above to, for example, a post-treatment such as grinding and polishing.

The preferred embodiments of the present invention have been described above, but the present invention is not limited thereto.

For example, the case where the ferrite powder is dispersed and present in the resin material in the resin composition has been mainly described in the embodiment described above. Alternatively, in the resin composition, for example, the ferrite powder may be precipitated in a liquid in advance, and dispersed by stirring or the like as required, to thereby be used. In addition, for example, the resin composition according to the present invention may be a dispersion liquid obtained by dispersing the ferrite powder and the resin particles in a volatile liquid. The resin composition according to the present invention may have, for example, a constitution obtained by simply mixing the ferrite powder with a resin powder.

In addition, the ferrite powder according to the present invention may be manufactured by any method, and the manufacturing method is not limited to the method as described above.

EXAMPLE

Hereinafter, the present invention will be described in detail based on Examples and Comparative Examples, but the present invention is not limited thereto. In the following description, treatment and measurement whose temperature conditions are not specifically shown were performed at room temperature (25° C.).

1. Production of Ferrite Powder

Example 1

First, iron oxide ($Fe_2O_3$) and strontium carbonate ($SrCO_3$) were weighed at a molar ratio of $Fe_2O_3/SrCO_3=5.75$, and mixed, and water was added thereto, followed by pulverization, to prepare a slurry having a solid content of 50 mass %. Next, the prepared slurry was granulated with a spray dryer, and classified with a gyro shifter and a turbo classifier to prepare a granulated product having an average particle diameter of 15 μm.

Next, the granulated product was converted into a ferrite by performing thermal-spraying under the conditions of the transportation speed of about 40 m/s and the temperature of 2,000° C. while supplying propane gas at 10 $Nm^3/h$ and oxygen gas at 35 $Nm^3/h$, and then the ferrite particles were rapidly cooled in the atmosphere by being transported on the airflow supplied by air. At this time, the thermal-spraying was performed while the granulated product was made flow continuously, so that the particles after the thermal-spraying and rapid-cooling were independent without binding to each other.

Subsequently, the cooled particles were collected by a filter provided on the downstream side of the airflow. At this time, particles having a large particle diameter dropped in the middle of the airflow and collected by the cyclone, and thus not collected by the filter.

Next, the collected particles were classified by the gyro shifter and the turbo classifier, and a coarse powder whose particle diameter exceeds 2,000 nm was removed, so as to obtain ferrite powder. That is, the maximum particle diameter of the ferrite particles constituting the obtained ferrite powder was 2,000 nm or smaller.

Examples 2 and 3

Ferrite powders were manufactured in the same manner as that in Example 1 each except that the mixing ratio of iron oxide and strontium carbonate was changed as shown in Table 1 below.

Example 4

Ferrite powder was manufactured in the same manner as that in Example 3 except that carbon black was added in a content of 0.5 mass % in the entire raw material for the thermal-spraying as an additive (combustion aid) during the thermal-spraying.

It should be noted that in the above-mentioned Examples, all of the particle diameters of the granulated products were values in a range of 0.5 μm or more and 30 μm or less, all of the viscosities of the slurries (values measured at 25° C. by using a B-type viscometer (viscotester manufactured by Rion Co., Ltd.)) were values in a range of 0.5 poise or higher and 4 poise or lower, all of the mixing ratios of oxygen gas to the combustion gas in the mixed gas were ratios of 35 $Nm^3/h$ or more and 60 $Nm^3/h$ or less of oxygen gas to 10 $Nm^3/h$ of the combustion gas, all of the flow rates of the granulated products transported were values in a range of 20 m/s or higher and 60 m/s or lower, and all of the temperature during the thermal-spraying was 2,000° C.

Comparative Examples 1 and 2

Ferrite powders were manufactured in the same manner as in that in Example 1 each except that the amounts of iron oxide and strontium carbonate used were changed as shown in Table 1 below.

Comparative Example 3

First, iron oxide ($Fe_2O_3$) and strontium carbonate were weighed at a molar ratio of $Fe_2O_3/SrCO_3=5.75$, and were mixed with a Henschel mixer, so as to prepare a raw material mixture.

Next, the obtained granulated product was accommodated in a sagger and fired in an electric furnace at 1,100° C. for four hours in the air to be converted into ferrite, so as to obtain a fired product in the form of lumps conforming to the shape of the sagger. The obtained fired product was pulverized by grinding by a mortar, to manufacture ferrite powder.

The constitutions of the ferrite powders of Examples and Comparative Examples are summarized and shown in Table 1 below. With regard to the ferrite powders (ferrite particles) according to Examples and Comparative Examples, chemical analysis (elemental analysis), analysis of unevenly-distributed surface elements, observation of the crystal form and particle shape, measurement of the average particle diameter and BET specific surface area were performed as follows.

(Chemical Analysis)

The contents of the metal components in the ferrite powder were measured as follows. First, 0.2 g of ferrite powder was weighed, thereto was added a mixture prepared by adding 20 mL of 1 N hydrochloric acid and 20 mL of 1 N nitric acid to 60 mL of pure water, followed by heating, so as to prepare an aqueous solution in which the ferrite powder was completely dissolved. The obtained aqueous solution was set in an ICP analyzer (manufactured by Shimadzu Corporation, ICPS-1000IV), and the contents of the metal components in the ferrite powder was measured. The expression "<0.01" in the column of the chemical analysis in Table 1 refers to a measurement error, or means that it is present as an inevitable impurity derived from a raw material, a producing process or the like.

(Unevenly-Distributed Surface Elements)

The ferrite particles were observed by a scanning transmission electron microscope (HD-2700 Cs-corrected STEM (manufactured by Hitachi High-Technologies Corporation)), and the obtained image (STEM image) was subjected to an energy dispersive X-ray (EDX) analysis. EDAX Octane T Ultra W (manufactured by AMETEK) was used for the analysis. As a result, it was confirmed that Sr was unevenly distributed on the surfaces of the ferrite particles in each of the above-mentioned Examples.

EDX analysis results of the ferrite particles in Example 4 are shown in FIG. 1 to FIG. 3. More specifically, FIG. 1 shows an analysis result of Fe in the ferrite particles according to Example 4, FIG. 2 shows an analysis result of Sr in the ferrite particles according to Example 4, and FIG. 3 is a view showing a combined analysis result of Fe and Sr for the ferrite particles according to Example 4. As can be also seen from these images, it is clear that although Sr is present inside the particles, Sr is also present in the vicinity of the particle surface (unevenly distributed on the surface). In addition, for the ferrite particles according to other embodiments, similar results to that in FIG. 1 to FIG. 3 were obtained.

(Particle Shape)

The shape of the ferrite particles was observed by using a transmission electron microscope HF-2100 Cold FE-TEM (manufactured by Hitachi High-Technologies Corporation). The acceleration voltage was set as 200 kV. FIG. 4 shows an image of a TEM image (magnification of 400,000) of the ferrite particles according to Example 4. All of the ferrite particles in Examples had the average spherical ratios of values in the range of 1.11 or more and 1.33 or less.

(Crystal Form)

The crystal form of the ferrite particles was observed by using a scanning transmission electron microscope HD-2700 Cs-corrected STEM (manufactured by Hitachi High-Technologies Corporation). The acceleration voltage was set as 200 kV. FIG. 5 shows an image of an electron beam diffraction pattern of the ferrite particles according to Example 4.

(Average Particle Diameter)

Horizontal Feret diameter was taken as the average particle diameter for the ferrite particles in Examples and Comparative Examples 1 and 2. A volume average particle diameter was taken as the average particle diameter for the ferrite particles in Comparative Example 3.

The horizontal Feret diameter was determined as follows. That is, the ferrite particles were photographed at magnification of 100,000 by using a scanning electron microscope FE-SEM (manufactured by Hitachi High-Technologies Corporation, SU-8020). At this time, the ferrite particles were photographed in a field where 100 or more particles can be counted. The photographed SEM image was read with a scanner, and an image analysis was performed by using image analysis software (Image-Pro PLUS, manufactured by Media Cybernetics). For the obtained image of particles, the horizontal Feret diameter of each particle was measured manually. FIG. 6 shows the SEM image of the ferrite powder according to Example 4.

The volume average particle diameter was determined as follows. That is, 10 g of ferrite powder and 80 mL of water serving as a dispersion medium were placed in a beaker, 2 to 3 drops of sodium hexametaphosphate serving as a dispersant were added thereto. Then, the obtained solution was oscillated at an output level 4 for 20 seconds by an ultrasonic homogenizer (manufactured by SMT Corporation, UH-150) to disperse the ferrite powder in the solution. Next, bubbles generated on the beaker surface were removed, and then solid-liquid separation was performed to recover ferrite powder. The volume average particle diameter of the recovered ferrite powder was measured by using a microtrack particle diameter analyzer (manufactured by Nikkiso Co., Ltd., Model 9320-X100).

(BET Specific Surface Area)

The measurement of the BET specific surface area was performed by using a specific surface area measurement device (manufactured by Mountech Co. Ltd., Macsorb HM model-1208). First, about 10 g of the obtained ferrite powder was placed on a drug packing paper and degassed by a vacuum dryer, the vacuum degree was confirmed to be −0.1 MPa or lower and then, the ferrite powder was heated at 200° C. for two hours to remove water adhering to the surface of the ferrite particles. Subsequently, about 0.5 g to 4 g of ferrite powder (ferrite particles), from which water had been removed, was placed in a standard sample cell dedicated to the specific surface area measurement device, and was accurately weighed by a precision balance. Subsequently, the weighed ferrite powder was set in the measurement port of this device and was measured. The measurement was performed by a one-point method. The temperature of the measurement atmosphere was 10 to 30° C., and the relative humidity thereof was 20 to 80% (without condensation).

2. Evaluation of Ferrite Particles (Saturation Magnetization, Residual Magnetization, and Coercive Force)

First, ferrite powder was packed in a cell having an inner diameter of 5 mm and a height of 2 mm, and was set in a vibrating sample magnetometer (manufactured by Toei Industry Co., Ltd., VSM-C7-10A). Next, an applied magnetic field was applied and swept to 10 K·1000/4πA/m, and then the applied magnetic field was reduced to create a hysteresis curve. Thereafter, the saturation magnetization, the residual magnetization and the coercive force were determined from data of the curve.

(Powder Resistance (Volume Resistivity))

First, a fluororesin-made cylinder having a cross-sectional area of 1.77 cm$^2$ was filled with a sample (ferrite powder) up to the height of 1.3 mm, then electrodes were attached on two ends, and 1 kg of weight was further placed further thereon. Subsequently, measurement voltage was applied stepwise from 50 V to 1,000 V in 50 V steps every 5 seconds to the electrodes by using a 6517A insulation resistance tester manufactured by Keithley Corporation, and a current value after 5 seconds of each step was measured. The volume resistivity was calculated from the obtained current values and the applied voltage.

TABLE 1

| | Pre-firing conditions (first firing) | | | | | Main-firing (second firing or heat treatment) | |
|---|---|---|---|---|---|---|---|
| | Raw material preparation mol ratio | | Firing temperature | Firing atmosphere | (Thermal-spraying) raw material diameter | Additive Carbon black | Firing method | Firing temperature |
| | Fe$_2$O$_3$ | SrCO$_3$ | [° C.] | | [μm] | | | [° C.] |
| Ex. 1 | 5.75 | 1 | 1,100 | air | 15 | — | thermal-spraying | 2,000 |
| Ex. 2 | 4 | 1 | 1,100 | air | 15 | — | thermal-spraying | 2,000 |
| Ex. 3 | 3 | 1 | 1,100 | air | 15 | — | thermal-spraying | 2,000 |
| Ex. 4 | 5.75 | 1 | 1,100 | air | 15 | 0.5 wt % | thermal-spraying | 2,000 |
| Comp. Ex. 1 | 5.75 | 0 | 1,100 | air | 15 | — | thermal-spraying | 2,000 |
| Comp. Ex. 2 | 2 | 1 | 1,100 | air | 15 | — | thermal-spraying | 2,000 |
| Comp. Ex. 3 | 5.75 | 1 | 1,100 | air | 5 | — | electric furnace | 900 |

| | Chemical analysis (ICP) [mass %] | | | | Presence or absence of uneven distribution of Sr on particle surface | Shape | Crystal form | Average particle diameter [nm] | BET specific surface area [m$^2$/g] |
|---|---|---|---|---|---|---|---|---|---|
| | Fe | Mn | Mg | Sr | | | | | |
| Ex. 1 | 67.0 | 0.4 | <0.01 | 2.7 | presence | polyhedron | single crystal | 95 | 10.46 |
| Ex. 2 | 65.2 | 0.7 | <0.01 | 5.1 | presence | polyhedron | single crystal | 107 | 12.53 |
| Ex. 3 | 62.0 | 0.7 | <0.01 | 9.5 | presence | polyhedron | single crystal | 103 | 12.56 |
| Ex. 4 | 63.2 | 0.5 | <0.01 | 5.9 | presence | polyhedron | single crystal | 98 | 13.18 |
| Comp. Ex. 1 | 65.86 | 0.31 | 0.08 | <0.01 | absence | true spherical shape | single crystal | 85 | 15.05 |
| Comp. Ex. 2 | 52.9 | 0.7 | <0.01 | 19.4 | presence | polyhedron | single crystal | 65 | 11.56 |
| Comp. Ex. 3 | 62.3 | 0.5 | 0.04 | 8.4 | absence | shapeless | polycrystalline | 9,070 | 1.10 |

3. Manufacture of Resin Composition

The resin compositions were prepared as follows by using the ferrite powders according to Examples and Comparative Examples.

That is, 20 parts by mass of ferrite powder was mixed with 20 parts by mass of epoxy resin in terms of resin solid content and 60 parts by mass of toluene, and the ferrite powder was dispersed by using a homogenizer, so as to manufacture a resin composition.

4. Manufacture of Molded Article

Each of resin compositions according to Examples and Comparative Examples obtained as described above was used to form a coating film on a PET film as a base material by using a baker applicator (manufactured by Tester Sangyo Co., Ltd., SA-201). The thickness of the coating film was set as 1 mil (25.4 μm), and the width of the coating film was set as 10 cm. Thereafter, the solvent was dried and the resin was cured, so as to obtain a resin film as a molded article.

5. Evaluation of Resin Composition and Molded Article

The resin compositions and the molded articles according to Examples and Comparative Examples were evaluated as follows.

(Evaluation of Coating Film Uniformity Based on Light Transmission)

The resin compositions according to Examples and Comparative Examples were observed by eyes, and whether the ferrite powder could be applied was evaluated according to the following criteria.

A: When light is applied to the obtained coating film (including the PET film) from the back, the light is not transmitted. (ferrite powder can be applied uniformly)

B: When light is applied to the obtained coating film (including the PET film) from the back, there is a partially bright place. (uneven thickness occurs)

C: When light is applied to the obtained coating film (including the PET film) from the back, the light is transmitted.

(Evaluation with a Metal Detector Using the Obtained Coating Film)

The coating films (including the PET film) according to Examples and Comparative Examples were cut into 20 mm×20 mm, the obtained samples were passed through a belt conveyor metal detector (manufactured by System Square, META-HAWKII), and the sensitivity (iron ball sensitivity (F value), SUS ball sensitivity (S value)) at which the sample can be detected was determined.

The results of the evaluation of the above-mentioned ferrite particles and the evaluation of the coating films are summarized and shown in Table 2.

TABLE 2

| | VSM magnetic property (@10 KOe) | | | | | Evaluation with metal detector | |
| --- | --- | --- | --- | --- | --- | --- | --- |
| | Saturation magnetization $(Am^2/kg)$ | Residual magnetization $(Am^2/kg)$ | Coercive force (kA/m) | volume resistivity in 5,000 v/cm | Evaluation of coating film uniformity | Iron ball sensitivity: F value | SUS ball sensitivity: S value |
| Ex. 1 | 63.8 | 27.6 | 46.6 | $1.10 \times 10^7$ | A | φ0.8 to 1.0 | φ0.6 to 0.8 |
| Ex. 2 | 51.7 | 25.0 | 84.0 | $1.23 \times 10^7$ | A | φ0.8 | φ0.8 to 1.0 |
| Ex. 3 | 25.7 | 12.2 | 101.5 | $1.56 \times 10^8$ | A | φ0.5 | φ1.0 to 1.2 |
| Ex. 4 | 48.8 | 26.0 | 116.0 | $1.19 \times 10^7$ | A | φ0.8 | φ1.0 to 1.2 |
| Comp. Ex. 1 | 64.1 | 12.1 | 9.4 | $1.36 \times 10^6$ | A | φ0.8 to 1.0 | Less than φ0.5 (undetectable) |
| Comp. Ex. 2 | 16.2 | 6.3 | 64.0 | $8.53 \times 10^7$ | A | Less than φ0.5 (undetectable) | φ0.8 |
| Comp. Ex. 3 | 57.0 | 35.0 | 270.0 | $6.83 \times 10^9$ | C | φ0.8 | φ1.5 |

As is clear from Table 2, excellent results were obtained in the present invention, whereas satisfactory results were not obtained in Comparative Examples.

INDUSTRIAL APPLICABILITY

The ferrite powder according to the present invention contains a plurality of ferrite particles. The ferrite particles are a single crystal having an average particle diameter of 1 nm or more and 2,000 nm or less, and have a polyhedral shape. The ferrite particles contain Sr in an amount of 2.0 mass % or more and 10.0 mass % or less, and contain Fe in an amount of 55.0 mass % or more and 70.0 mass % or less. Therefore, it is possible to provide ferrite powder having a small particle diameter, high coercive force and excellent dispersibility in a resin or a solvent. Therefore, the ferrite powder according to the present invention has industrial applicability.

Although the present invention has been described in detail with reference to specific embodiments, it is apparent to those skilled in the art that various changes and modifications can be made without departing from the spirit and scope of the present invention.

This application is based on the Japanese Patent Application filed on Mar. 31, 2017 (JP-A-2017-073209), the contents of which are incorporated herein by reference.

The invention claimed is:

1. A ferrite powder, comprising:
   a plurality of ferrite particles,
   wherein the ferrite particles have an average particle diameter of 95 nm or more and 300 nm or less, and have a polyhedral shape,
   wherein the ferrite particles comprise Sr in an amount of 2.0 mass % or more and 10.0 mass % or less, and Fe in an amount of 55.0 mass % or more and 70.0 mass % or less,
   wherein the Sr is distributed nonuniformly at and towards a surface of the ferrite particles, and
   wherein the ferrite particles are single crystals.

2. A resin composition comprising the ferrite powder described in claim 1.

3. A molded article comprising a part formed of the resin composition described in claim 2.

\* \* \* \* \*